US007359206B2

(12) United States Patent
Toy et al.

(10) Patent No.: US 7,359,206 B2
(45) Date of Patent: Apr. 15, 2008

(54) RADIO FREQUENCY ISOLATION SYSTEM AND COVER ASSEMBLY FOR VACUUM ELECTRON DEVICE

(75) Inventors: Wilson Wai Toy, San Francisco, CA (US); Christopher Paul Yates, Boulder Creek, CA (US); Paul Allen Krzeminski, San Mateo, CA (US); Robert N. Tornoe, Sunol, CA (US); Edmund Thomas Davies, Orinda, CA (US)

(73) Assignee: Communications and Power Industries, Inc., Palo Alto, CA (US)

( * ) Notice: Subject to any disclaimer, the term of this patent is extended or adjusted under 35 U.S.C. 154(b) by 0 days.

(21) Appl. No.: 11/370,429

(22) Filed: Mar. 7, 2006

(65) Prior Publication Data

US 2006/0148289 A1 Jul. 6, 2006

Related U.S. Application Data

(62) Division of application No. 09/778,387, filed on Feb. 6, 2001, now Pat. No. 7,029,296.

(60) Provisional application No. 60/180,798, filed on Feb. 7, 2000.

(51) Int. Cl.
*H05K 7/15* (2006.01)

(52) U.S. Cl. ...................................... 361/725; 361/815

(58) Field of Classification Search ................ 439/607; 313/312, 313; 361/816–818, 692, 693, 815, 361/725, 679; 330/68

See application file for complete search history.

(56) References Cited

U.S. PATENT DOCUMENTS

| | | | | |
|---|---|---|---|---|
| 697,459 | A | | 4/1902 | Ecroyd et al. |
| 1,106,459 | A | | 8/1914 | Knauff |
| 1,382,914 | A | * | 6/1921 | Hoxie ......................... 330/68 |
| 1,537,228 | A | * | 5/1925 | Gargan ...................... 361/692 |
| 1,545,639 | A | * | 7/1925 | Cohen ......................... 439/32 |
| 1,700,538 | A | | 1/1929 | Grant et al. |

(Continued)

FOREIGN PATENT DOCUMENTS

| | | |
|---|---|---|
| EP | 0 753 878 | 1/1997 |

(Continued)

*Primary Examiner*—Neil Abrams
(74) *Attorney, Agent, or Firm*—Thelen Reid Brown Raysman & Steiner LLP

(57) ABSTRACT

A self-guiding cover assembly for a vacuum electron device (VED) enclosure (704, 1316) has a cover (1002, 1302), a pair of guide plates, and a pair of guide elements (1304, 1306). The cover has at least one electrical connector (1314) disposed on the inside thereof for mating with a VED. The pair of guide plates is disposed on opposite sides of the outside of the sidewall of the cover. The guide plates each have a track (1310) which guides the guide elements (1304, 1306) mounted on the cover such that the cover is constrained in its motion when opening or closing in order to avoid damaging the connectors to the VED. The cover further comprises a breach lock mechanism for seating the VED into the VED enclosure by rotation of a sleeve (714). The cover (1002, 1302) defines first (1004) and second (1006) chambers separated by a panel 1010. The top of the VED protrudes into the first chamber through an adapter plate 802 having hole 804 for passage of the VED there through.

10 Claims, 17 Drawing Sheets

U.S. PATENT DOCUMENTS

| | | | | |
|---|---|---|---|---|
| 1,747,938 | A * | 2/1930 | Hull | 330/68 |
| 1,839,876 | A | 1/1932 | Hartman | 422/186.18 |
| 1,875,132 | A * | 8/1932 | Peterson | 330/68 |
| 2,014,872 | A | 9/1935 | Wells et al. | |
| 2,164,507 | A | 7/1939 | Espe | 250/27.5 |
| 2,325,186 | A * | 7/1943 | Larson | 361/819 |
| 2,357,214 | A | 8/1944 | McDole | 312/235.4 |
| 2,439,412 | A * | 4/1948 | Mitchell | 455/187.1 |
| 2,462,370 | A | 2/1949 | Drake | 333/255 |
| 2,521,945 | A | 9/1950 | Rado | 333/229 |
| 2,710,904 | A | 6/1955 | Crane et al. | 219/17 |
| 2,893,704 | A * | 7/1959 | Passman | 165/80.3 |
| 2,922,957 | A | 1/1960 | Haszard | |
| 3,027,535 | A | 3/1962 | Persson | |
| 3,039,203 | A | 6/1962 | Winkler | 35/10 |
| 3,189,212 | A | 6/1965 | Bellek | 220/3.3 |
| 3,273,021 | A * | 9/1966 | Stark, Jr. et al. | 361/692 |
| 3,364,838 | A * | 1/1968 | Bradley | 312/213 |
| 3,444,419 | A | 5/1969 | Hansen et al. | 315/3.5 |
| 3,686,425 | A | 8/1972 | Zerwes et al. | 174/53 |
| 3,716,815 | A | 2/1973 | Riches | 439/142 |
| 3,816,911 | A * | 6/1974 | Knappenberger | 29/841 |
| 3,848,088 | A | 11/1974 | Bentz | 358/305 |
| 4,254,335 | A | 3/1981 | Tondello et al. | 378/70 |
| 4,370,515 | A * | 1/1983 | Donaldson | 174/387 |
| 4,408,141 | A | 10/1983 | Byszewski et al. | |
| 4,494,095 | A * | 1/1985 | Noji et al. | 334/85 |
| 4,672,160 | A | 6/1987 | Katoh | |
| 5,150,001 | A | 9/1992 | Crewe | |
| 5,376,020 | A | 12/1994 | Jones | 439/537 |
| 5,416,381 | A | 5/1995 | Scarpetti, Jr. et al. | 313/446 |
| 5,450,173 | A | 9/1995 | Bekanich | |
| 5,614,694 | A * | 3/1997 | Gorenz et al. | 174/375 |
| 5,762,224 | A | 6/1998 | Benn et al. | 220/4.02 |
| 5,767,625 | A | 6/1998 | Shrader et al. | 315/5.37 |
| 5,844,784 | A * | 12/1998 | Moran et al. | 361/818 |
| 5,961,203 | A | 10/1999 | Schuda | |
| 5,968,455 | A | 10/1999 | Brickley | |
| 6,057,635 | A | 5/2000 | Nishimura et al. | 313/25 |
| 6,297,446 | B1 * | 10/2001 | Cherniski et al. | 174/383 |
| 6,300,610 | B1 | 10/2001 | Han et al. | |
| 6,449,150 | B1 * | 9/2002 | Boone | 361/694 |
| 6,676,277 | B1 | 1/2004 | Gordin | 362/263 |

FOREIGN PATENT DOCUMENTS

| | | |
|---|---|---|
| EP | 0 948 024 | 10/1999 |
| GB | 2 277 193 | 10/1994 |

* cited by examiner

RADIO FREQUENCY ISOLATION SYSTEM AND COVER ASSEMBLY FOR VACUUM ELECTRON DEVICE

CROSS-REFERENCE TO RELATED APPLICATION(S)

The present application is a divisional of U.S. patent application Ser. No. 09/778,387, filed Feb. 6, 2001, now U.S. Pat. No. 7,029,296, issued Apr. 18, 2006, entitled, "Cover Assembly for Vacuum Electron Device" in the names of Wilson W. Toy, Christopher Yates, Paul Krzeminski, Robert N. Tornoe, Edmund T. Davis and assigned to Communication and Power Industries, a Delaware Corporation, which claims the benefit of U.S. Provisional Patent Application Serial No. 60/180,798, filed Feb. 7, 2000.

BACKGROUND OF THE INVENTION

1. Field of the Invention

The present invention relates to vacuum electron devices (VEDs). More particularly, the present invention relates to input circuits for high power RF amplifiers which employ VEDs such as Klystrodes, Inductive Output Tubes (IOTs), and the like in the television broadcast service.

2. The Background Art

Vacuum tube amplifiers generally include an input circuit having three major components: the enclosure, the input resonator, and the socket. The enclosure houses the socket and the input resonator to which high voltage connections are made. Not only does the enclosure envelope the circuit, but its function is also to contain radio frequency (RF) energy within the RF compartment.

IOTs have limited life times and must be replaced from time to time. Existing IOT-based amplifier designs generally require complete removal of the amplifier input circuit from the transmitter in order to replace the VED. This process can be cumbersome and inconvenient. During tube replacement, electrical contact fingers in the socket may be easily damaged due to incorrect alignment. With damage to the contact fingers, RF energy may leak from the amplifier. RF leakage can also generate a substantial amount of heat or arcing which may damage wiring and components. In addition, misalignment may also cause RF leakage from the amplifier enclosure due to improper seating on an electro magnetic interference (EMI) gasket.

Even if the input circuit is properly seated, the high voltage leads can couple an undesirable percentage of the input RF into the transmitter's instrumentation. Due to spatial constraints, it is difficult to isolate the RF signals within the enclosure by loading it with ferrites (filter components, chokes and bobbins). Consequently, end-users currently place such RF isolation components in the transmitter output circuit. Despite the ability to combine RF components and high voltage components under the same cover, the spatial constraint limits the ability to improve the product. Aside from RF isolation, high voltage standoff issues make it difficult to incorporate a quick and easily accessible connection box.

FIG. 1 is an external perspective view of a conventional input circuit and enclosure of an amplifier employing a VED in accordance with the prior art. An enclosure cover 10 houses a radio frequency (RF) connection and high voltage connections to a VED (not shown). An air distribution system comprising a tree 12 and branches 14 access the VED enclosure through a separate entry 16 from cover 10.

FIG. 2 is a cross-sectional drawing of an input resonator and socket for a VED in accordance with the prior art. The input resonator comprises a parallel LC circuit. The inductance is provided by a shorting pin (not shown) located between the cathode 21 and grid 24 lines. The capacitance is generated by a cathode and grid structure (not shown) located in the VED. The input resonator is capacitively tuned such that the structure's parallel circuit resonant frequency matches the operational carrier frequency the VED is operated at. The cathode 21 and grid 24 lines also serve as socket collets which affix to their corresponding surfaces on the VED (not shown). The collets transfer the input RF energy to the input section of the VED. In addition, the cathode line delivers the DC beam voltage to the VED's cathode. The grid line distributes the bias voltage to the VED's grid. The socket is also comprised of a heater collet 25 and a vacion 31 contact. The heater collet delivers a DC voltage to the VED to provide power needed to operate the VED's cathode (not shown) at an elevated temperature. The vacion contact provides a DC voltage required to operate an appendage vacuum pump (not shown) located on the VED.

In operation, an alternating RF voltage is applied between the cathode 21 and grid 24 lines. The input RF voltage propagates to the input section of the VED (not shown) generating a RF voltage between the VED's grid and cathode (not shown). The VED's cathode emits electrons resulting in a bunched (density modulated) electron beam. An anode structure (not shown) operating at a high DC beam voltage accelerates the bunched beam through the anode's aperture.

The heater collet 25 is retained to cathode lines 21 and 22 through C-Clips 26 as heater collet 25 heats up cathode lines 21 and 22. Mounting screws 27 retain heater collet 25 against a high voltage insulator 28. When heater collet 25 needs to be removed for maintenance, mounting screws 27 along with C-clips 26 must be disassembled. Therefore, when a user needs to replace a component of the RF socket that houses the heater line, the entire RF socket needs to be completely removed. Such components can easily be damaged during assembly or installation of the RF socket.

Accordingly, a need exists for an improved input circuit for an RF amplifier providing a high power output which provides a good seat alignment for the VED with an EMI gasket to prevent RF leakage, an easy assembly and disassembly mechanism, a proper cooling system with RF isolation, and an easy socket interface.

BRIEF DESCRIPTION OF THE INVENTION

A self guiding cover assembly for a vacuum electron device (VED) enclosure has a cover, a pair of guide plates, and a pair of guide elements. The cover has a top, a sidewall, an inside and an outside, and at least one electrical connector disposed on the inside of the cover for mating with a VED. The pair of guide plates is disposed on opposite sides of the outside of the sidewall of the cover. The guide plates each have a track. The pair of guide elements is mounted on opposite sides of the outside of the sidewall of the cover. The pair of guide elements each mates with the track. The cover further comprises a breach lock mechanism for seating the VED into the VED enclosure having a base. The breach lock mechanism has guide elements mounted on the VED. A first sleeve is mounted on the base and removably receives the VED. A second sleeve is mounted on the base and removably receives the first sleeve. The second sleeve has tracks for mating with the guide elements. A rotation of the second sleeve pulls the VED into the base for seating the VED.

BRIEF DESCRIPTION OF THE DRAWINGS

The accompanying drawings, which are incorporated in and constitute a part of this Specification, illustrate one or more embodiments of the invention and, together with the present description, serve to explain the principles of the invention.

In the drawings.

DETAILED DESCRIPTION OF A PREFERRED EMBODIMENT

Embodiments of the present invention are described herein in the context of high power RF amplifiers employing vacuum electron devices. Those of ordinary skill in the art will realize that the following description of the present invention is illustrative only and not intended to be in any way limiting. Other embodiments of the invention will readily suggest themselves to such skilled persons having the benefit of this disclosure. Reference will now be made in detail to implementations of the present invention as illustrated in the accompanying drawings. The same reference numbers will be used throughout the drawings and the following description to refer to the same or like parts.

In the interest of clarity, not all of the routine features of the implementations described herein are described. It will of course be appreciated that in the development of any such actual implementation, numerous implementation-specific decisions must be made to achieve the developer's specific goals, such as compliance with system and business-related goals, and these goals will vary from one implementation to another. Moreover, it will be appreciated that such a development effort might be complex and time-consuming, but would nevertheless be a routine, undertaking of engineering for those of ordinary skill in the art having the benefit of this disclosure.

Figure 3:
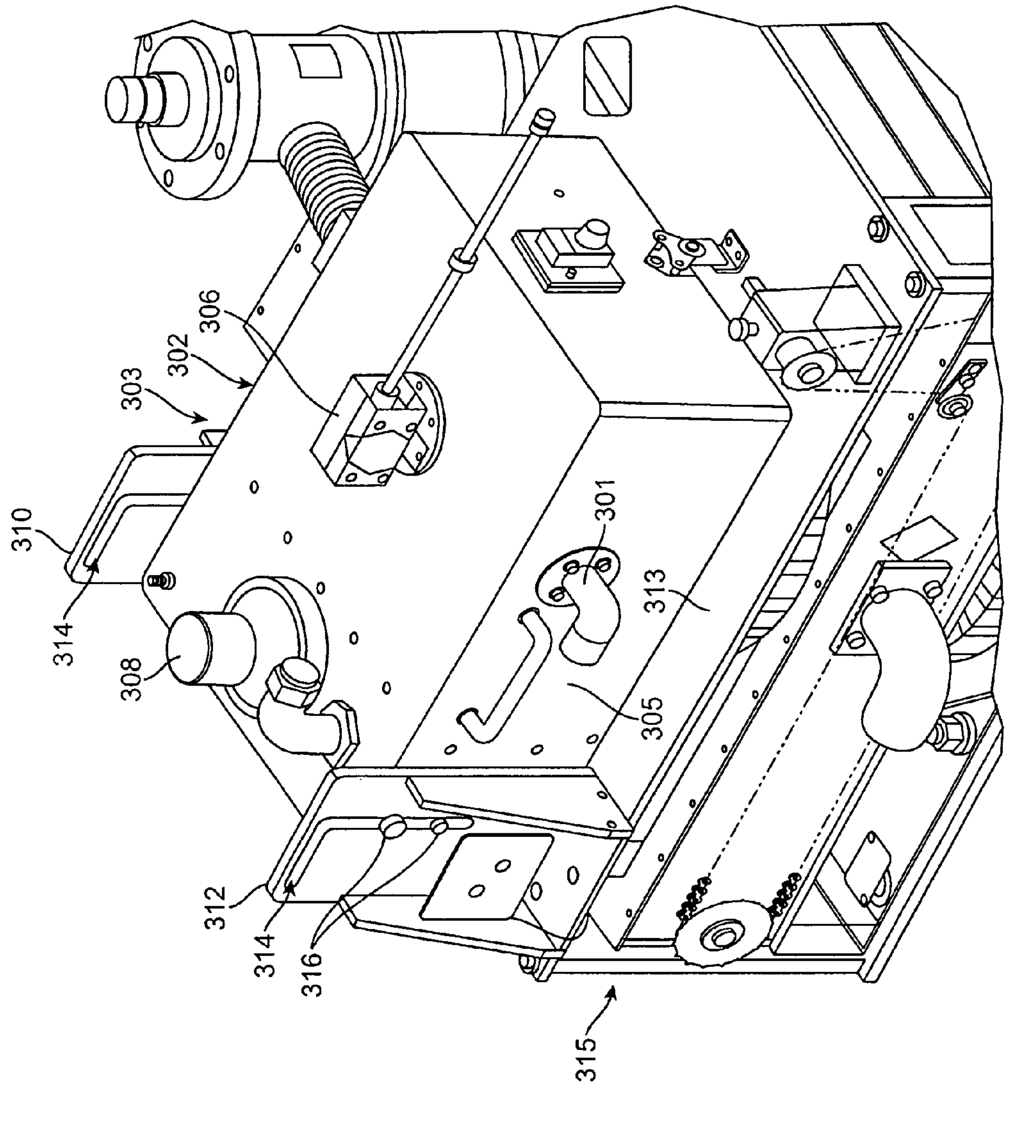
FIG. 3 is a perspective view of an input circuit and enclosure of a vacuum electron device in accordance with a specific embodiment of the present invention.

FIG. 3 is a perspective view of an input circuit and cover of a vacuum electron device in accordance with a specific embodiment of the present invention. Cover 302 houses a radio frequency (RF) connection to a vacuum electron device (VED) (not shown) and a high voltage connection (not shown) and a radio frequency (RF) compartment (not shown). An RF input 306 is connected to the RF connection (not shown) inside cover 302 through the top of cover 302. An air input system 308 (external air connection) enters on top of cover 302 to allow air to circulate air within cover 302. The cover 302 also includes another external air connection 301

A pair of guide plates 310 and 312 are mounted on top plate 313 of frame 315, or the top portion 1317 of a VED enclosure 1318 (FIG. 13), which maybe used in lieu of a frame. Plates 310 and 312 are disposed opposite to sidewalls 303 and 305 of cover 302. A track 314, slot, or other form of guide may be disposed within, through, or on guide plates 310 and 312 for defining a limited range of movement of cover 302. Track 314 may preferably be in the shape of an "L" as shown. A pair of guide elements, such as a pair of shafts 316, are detachably mounted on opposite sides of the outside of sidewalls 303 and 305 of cover 302. The pair of shafts 316 may be a pair of screws attached to cover 302 with a nut (not shown). The pair of shafts 316 engages track 314 of guide plates 310 and 312. The pair of guide plates 310 and 312 allow cover 302 to restrictively move along track 314.

The pair of guide plates 310 and 312 allows cover 302 to be aligned during its installation and removal. The pair of guide plates supports cover 302 when cover 302 is open by allowing the weight of cover 302 to rest on shafts 316. To prevent broken or bent contact fingers between cover 302 and the VED, track 314 physically requires that cover 302 be lifted vertically until cover 302 clears all interfaces. Furthermore, cover 302 may rotate 90 degrees followed by a horizontal push to the rear to lock in place allowing clearance for VED removal. Different track patterns can be used to accommodate transmitters with specific constraints. In addition, other mechanical systems, such as gas struts, springs and rotary/linear actuators can be implemented to assist and/or automate the system as shown as reference numeral 401 (referred to as a "movement system") in an example embodiment in FIGS. 4B-4D.

Figure 4A:
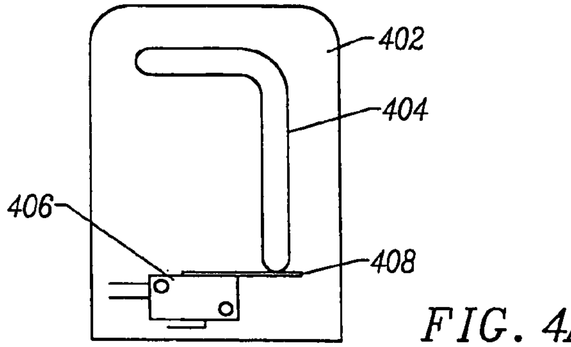
FIG. 4A is a side elevation plan view of a guide plate in accordance with a specific embodiment of the present invention.

FIG. 4A is a side elevation step view of a guide plate 402 in accordance with a specific embodiment of the present invention. Guide plate 402 contains a track 404 defining the range of movement for cover 302 of FIG. 3. Track 404 is in the form of an "L" shape allowing cover 302 to move horizontally and vertically within the defined path of track 404. A switch mechanism 406 mounted on the bottom of guide plate 402 may be employed to interrupt power to the high voltage connection preferably by sending a signal to a controller. Switch mechanism 406 may be in the form of an interlock mounting having a sensor 408, such as a tongue, for detecting the closed position of cover 302; when cover 302 is properly seated on VED enclosure 304 (closed position), one of the shafts 316 comes into contact with sensor 408 changing the state of switch 406 indicating closure. Thus, when cover 302 is lifted from its closed position, switch mechanism 406 changes state again indicating that cover 302 is open and that power should be interrupted to the high voltage connection.

Figure 4B:
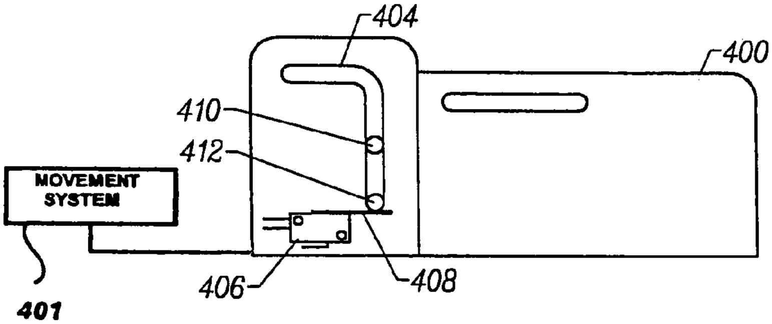
FIG. 4B is a side elevation plan view of a self guiding cover for a vacuum electron device enclosure in a closed position in accordance with a specific embodiment of the present invention.

FIG. 4B is a side elevation step view of a guide plate and a cover for a vacuum electron device enclosure in a closed position in accordance with a specific embodiment of the present invention. A cover 400 is in a closed position and is seated on top plate 313, or a top surface 1317 (FIG. 13) of a VED enclosure 1318. Shafts 410 and 412 are disposed inside track 404. Shaft 412 comes into contact with sensor 408. The pressure applied on sensor 408 by shaft 412 changes the state of switch 406 to indicate that power should be applied to the high voltage connection.

Figure 4C:
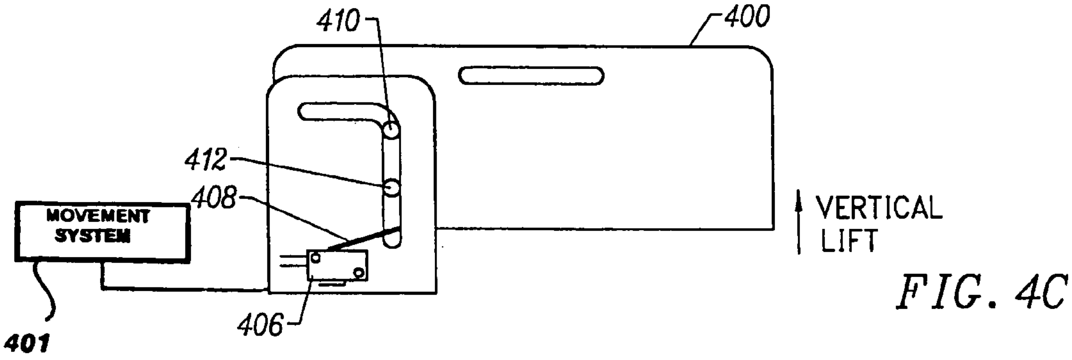
FIG. 4C is a side elevation plan view of a self guiding cover for a vacuum electron device enclosure in an open position in accordance with a specific embodiment of the present invention.

FIG. 4C is a side elevation plan view of a guide plate and a cover for a vacuum electron device enclosure in an open position in accordance with a specific embodiment of the present invention. Cover 400 is in an open position as it separates from the top plate 313, or the top surface 1317 (FIG. 13) of a VED enclosure 1318. Pair of shafts 410 and 412 moves along track 404 as cover 400 is lifted. Because shaft 412 no longer applies pressure on sensor 408, switch mechanism 406 interrupts power to the high voltage connection.

Figure 4D:
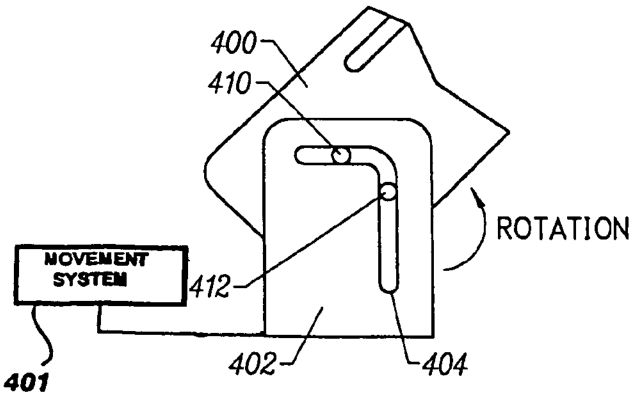
FIG. 4D is a side elevation plan view of a self guiding cover for a vacuum electron device enclosure in a rotating position in accordance with a specific embodiment of the present invention.

FIG. 4D is a side elevation plan view of a guide plate and a cover for a vacuum electron device enclosure in a rotating position in accordance with a specific embodiment of the present invention. As cover 400 rotates about guide plate 402, shafts 410 and 412 follow the "L" shaped path of track 404. Shafts 410 and 412 transition from a vertical path portion to a horizontal path portion causes cover 400 to rotate 90 degrees.

Figure 4E:
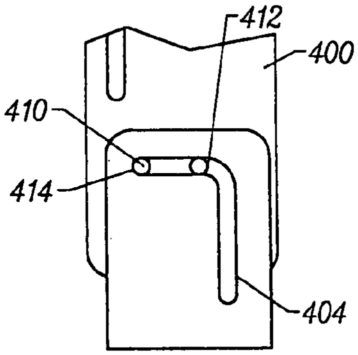
FIG. 4E is a side elevation plan view of a self guiding cover for a vacuum electron device enclosure in an open and locked position in accordance with a specific embodiment of the present invention.

FIG. 4E is a side elevation plan view of a guide plate and a cover for a vacuum electron device enclosure in an open and locked position in accordance with a specific embodiment of the present invention. As shafts 410 and 412 slide into a horizontal position within track 404, cover 400 stands in a vertical position above the top plate 313 or the top surface 1317 (FIG. 13) of a VED enclosure 1318. Cover 400 may be rested in a vertical position through the use of a notch 414 at the end of track 404. Notch 414 allows latch 410 to rest and therefore immobilizing cover 400. A horizontal push of cover 400 locks it in place.

Figure 5A:
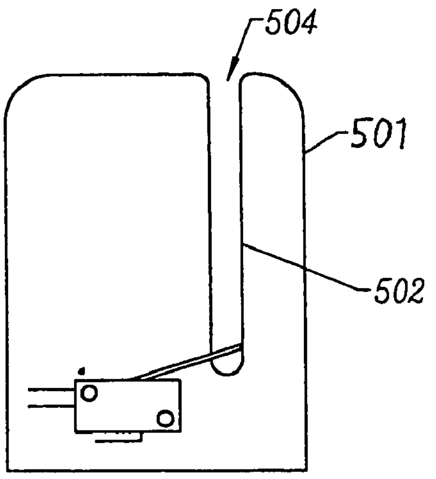
FIG. 5A is a side elevation plan view of a guide plate in accordance with an alternative specific embodiment of the present invention.

FIG. 5A is a side elevation plan view of a guide plate in accordance with an alternative specific embodiment of the present invention. A guide plate 500 has a slot track 502 having an opening 504 at the top end of track 502.

For transmitters with different vertical clearance requirements, an alternate track pattern or guide system can be used. By replacing the L-shaped track with an open slot as illustrated in FIG. 5A, a cover can be completely removed from the transmitter but it will still require a vertical lift.

Figure 5B:
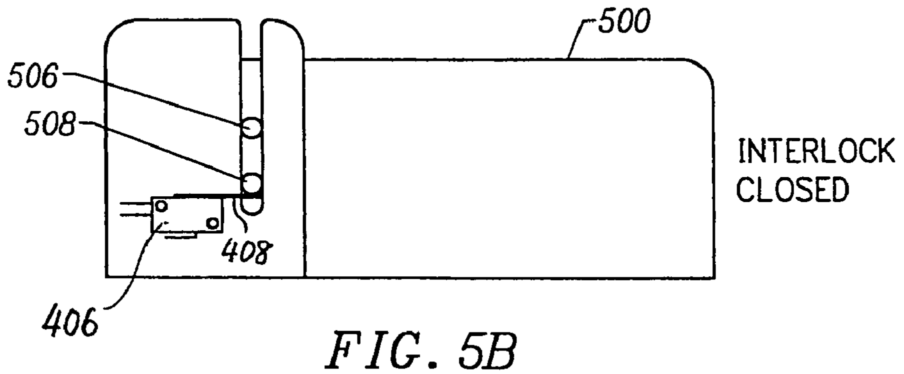
FIG. 5B is a side elevation plan view of a self guiding cover for a vacuum electron device enclosure in a closed position in accordance with an alternative specific embodiment of the present invention.

FIG. 5B is a side elevation plan view of a guide plate and cover for a vacuum electron device in a closed position in accordance with an alternative specific embodiment of the present invention. A cover 500 is in a closed position and is seated on a top plate 313, or a top surface 1317 (FIG. 13) of a VED enclosure 1318. Shafts 506 and 508 are disposed inside track 502. Shaft 508 comes into contact with sensor 408. The pressure applied on sensor 408 by shaft 508 allows power to the high voltage connection.

Figure 5C:
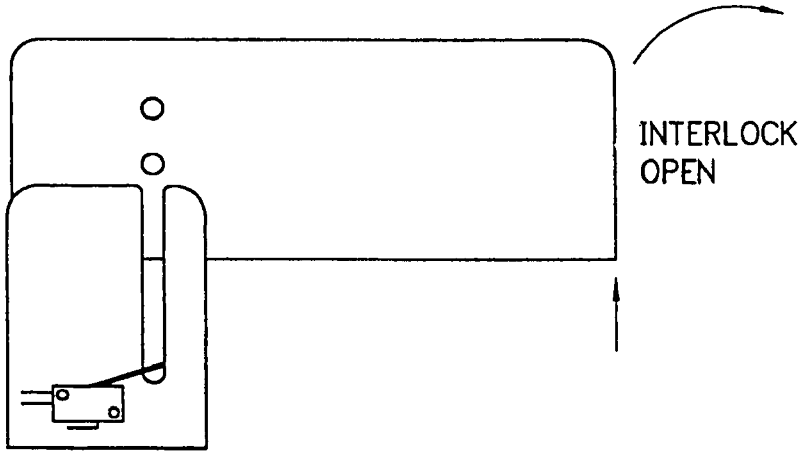
FIG. 5C is a side elevation plan view of a self guiding cover for a vacuum electron device enclosure in an open position in accordance with an alternative specific embodiment of the present invention.

FIG. 5C is a side elevation plan view of a guide plate and cover for a vacuum electron device in an open position in accordance with an alternative specific embodiment of the present invention. Cover 500 is lifted away from the top plate 313, or top surface 1317 (FIG. 13) of a VED enclosure 1318. Opening 504 allows cover 500 to be completely removed. Because sensor 408 does not detect shaft 508, power to high voltage connection is interrupted.

Figure 6A:
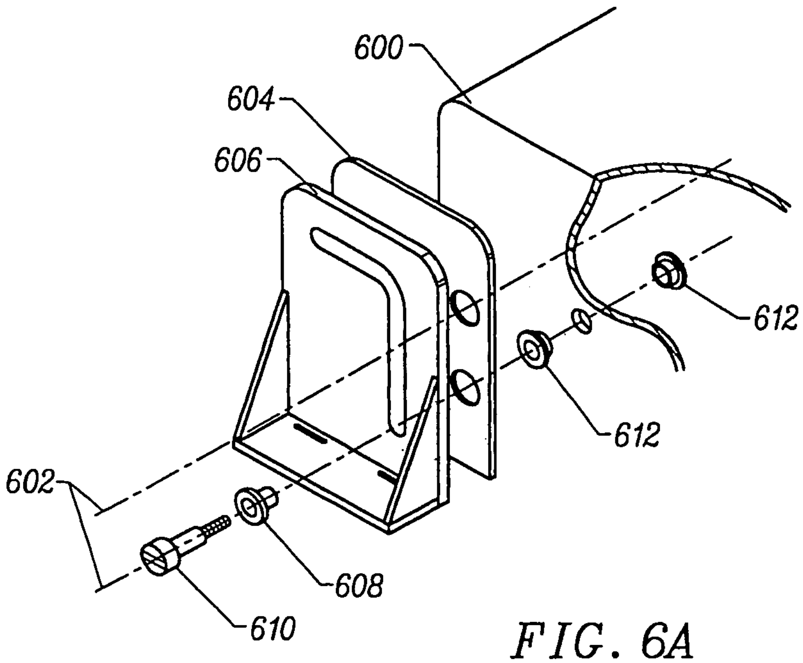
FIG. 6A is a cross sectional perspective view of a guide plate in contact with a vacuum electron device enclosure in accordance with a specific embodiment of the present invention.

FIG. 6A is a cross sectional perspective view of a guide plate in contact with a cover 600 in accordance with a specific embodiment of the present invention. To accommodate those transmitters with reduced vertical clearance, the interface between a cover and a guide plate is interchangeable. As illustrated in FIG. 6A, the components may interface with either system (FIG. 4A and FIG. 5A). Each side of a cover 600 consists of a pair of bearing axles 602, a Teflon slip plate 604, and a guide plate 606. Bearing axles 602, including a bearing 608, such as a flanged composite or metal bearing, and a shoulder crew 610, are mounted with inserts 612 that mechanically reinforce cover 600. Teflon slip plate 604 may be placed between guide plate 606 and cover 608 to prevent galling, binding and cocking.

Figure 6B:
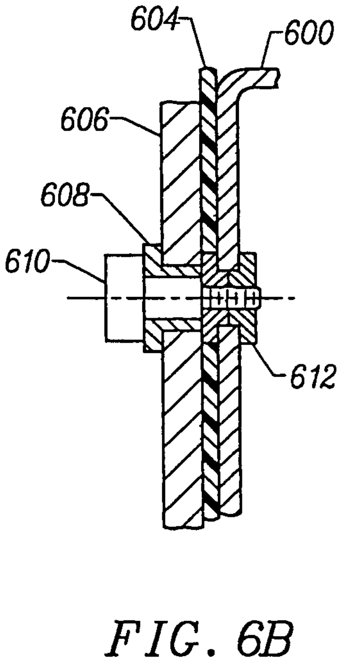
FIG. 6B is a cross sectional view of a guide plate in contact with a vacuum electron device enclosure in accordance with a specific embodiment of the present invention.

FIG. 6B is a cross sectional view of a guide plate in contact with a vacuum electron device cover in accordance with a specific embodiment of the present invention. FIG. 6B illustrates the connected interface between the cover 600 and the guide plate 606.

Other ways of aligning the cover may be a system of guideposts and eyebolts or slots, a frame mounted on the hardware, a hinge system that allows rotation to either side of the transmitter (if there is sufficient clearance), or a system to pivot the whole cover out of the transmitter.

Figure 7A:
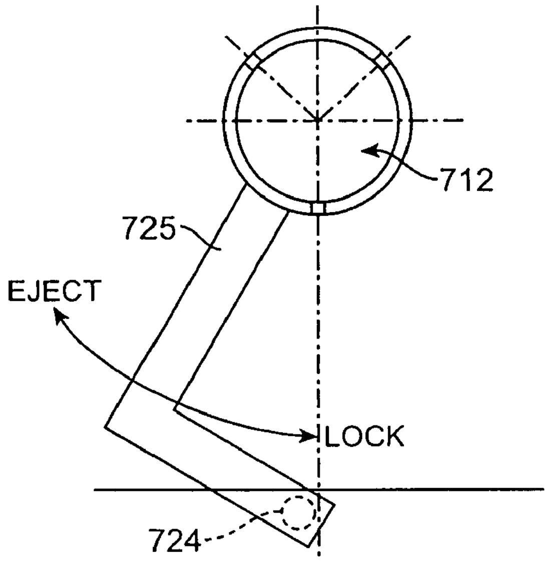
FIG. 7A is a top view of a breach lock mechanism for seating a VED in accordance with a specific embodiment of the present invention.
Figure 7B:
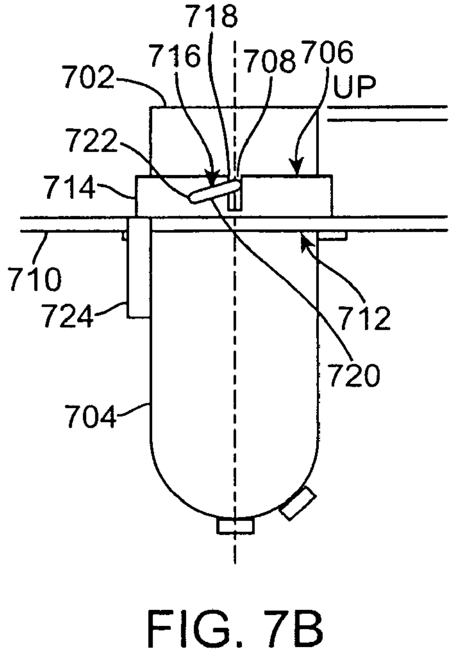
FIG. 7B is a side plan elevation view of a breach lock mechanism for seating a VED in accordance with a specific embodiment of the present invention.
Figure 7C:
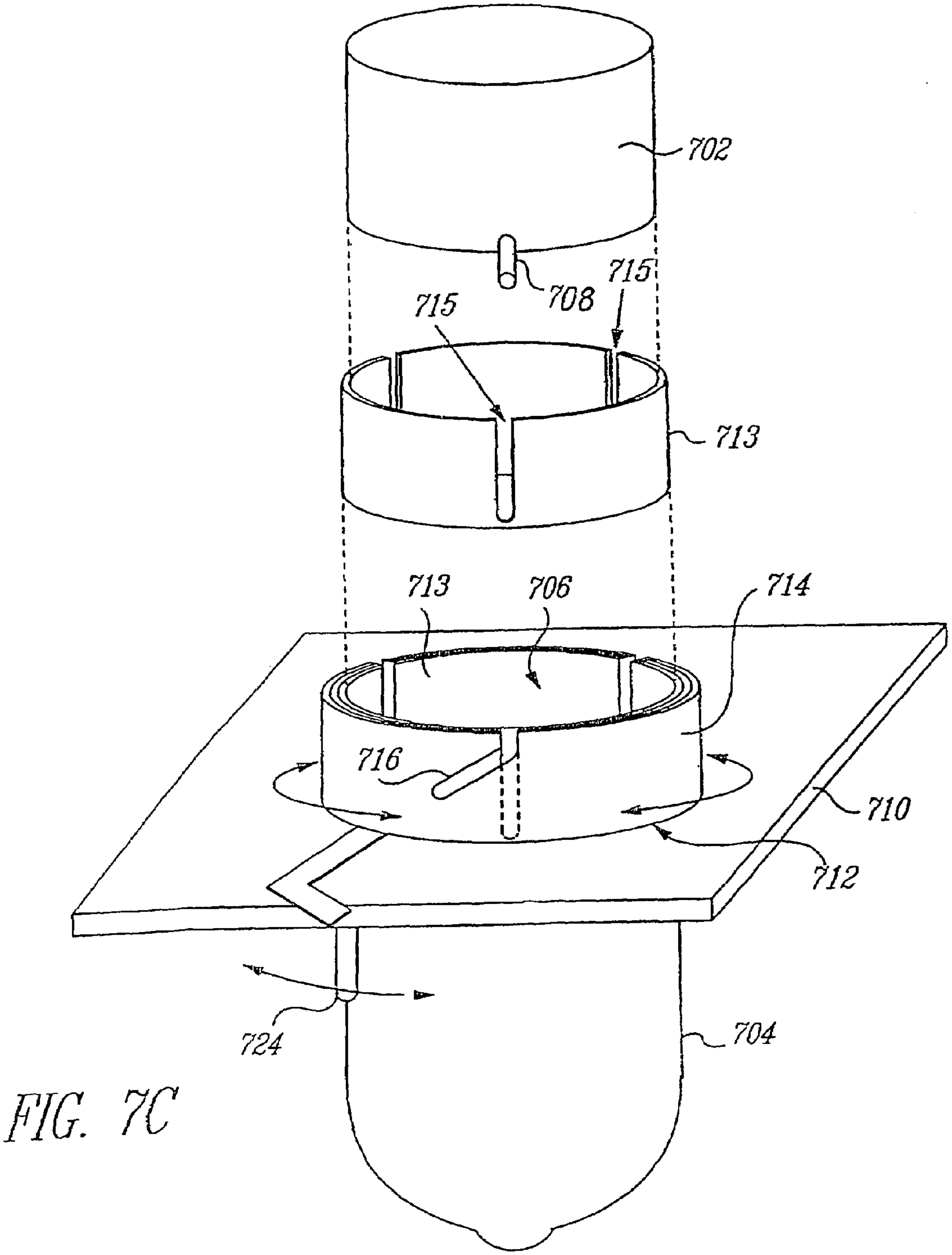
FIG. 7C is a perspective elevation view of a breach lock mechanism for seating a VED in accordance with a specific embodiment of the present invention.

FIG. 7A is a top view of a breach lock mechanism in an open position in accordance with a specific embodiment of the present invention. FIG. 7B is a side plan elevation view of a breach lock mechanism in an open position in accordance with a specific embodiment of the present invention. FIG. 7C is a perspective view of a breach lock mechanism for a VED. A VED 702 is seated into a VED casing 704 having a cavity. VED casing 704 may be in the shape of a round hollow cylinder having an opening 706 on one end. VED 702 has several pins 708 mounted on its exterior surface near opening 706 (only one pin 708 is shown in FIG. 7B). A support plate 710 similar to plate 317 in FIG. 3 and having an opening 712, removably receives VED casing 704.

A vertical guide assembly 713 is mounted on support plate 710 (or 317) around opening 712. Vertical guide assembly 713 is preferably a hollow cylinder having slots 715 disposed transversally around its edge. The slots have one open end directed away from support plate 710. The width of slots 715 is suitable for mating with pins 708. The movement of pins 708 is constrained by the shape of slots 715. Therefore, pins 708 can only move within the defined linear shape of slots 715 once they mate with slots 715.

A sleeve 714 sits on support plate 710 around opening 712 such that sleeve 714 can rotate around vertical guide assembly 713. The diameter of sleeve 714 is larger than the diameter of vertical guide assembly such that sleeve 714 embraces vertical guide assembly 713. Sleeve 714 has several slots (only one slot 716 is shown in FIG. 7B) for receiving the pins. For example, in FIG. 7B, slot 716 receives pin 708. Slot 716 has an opening 718, a middle portion 720, and a terminus 722. Opening 718 is located at the entrance of slot 716. Middle portion 720 is slanted and declines away from the entrance of slot 716. Terminus 722 has a notch declining towards the entrance of slot 716.

Sleeve 714 is connected to a handle 724 opposite to opening 712. Handle 724 is rigidly connected to arm 725 and can rotate about opening 712 between two end positions. When handle 724 and arm 725 rotate around VED 702, sleeve 714 rotates around vertical guide assembly 713. Pin 708 is restricted to move within slot 716. In particular, pin 708 enters through opening 718, middle portion 720, and terminus 722. When pin 708 reaches middle portion 720, it must follow the slanted path that declines away from opening 718. Furthermore, pin 708 is restricted to a path movement defined by slots 715. For example, when handle 724 rotates, pin 708 is actually engaged with both vertical assembly 713 and slots 715. As handle 724 rotates, pin 708 is constrained to the space defined by the intersection of slot 716 and slot 715. This results in lowering or raising VED 702 into VED casing 704. When VED 702 is lowered by rotating handle 724, VED 702 is seated and sealed onto VED casing 704. When pin 708 reaches terminus 722, handle 724 reaches a locked position.

Figure 8:
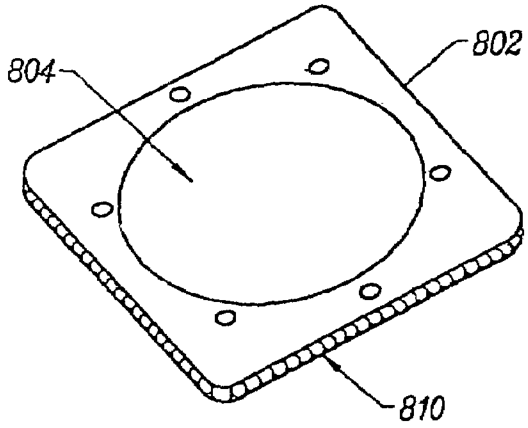
FIG. 8 is a perspective elevation view of an adapter plate in accordance with a specific embodiment of the present invention.
Figure 9:
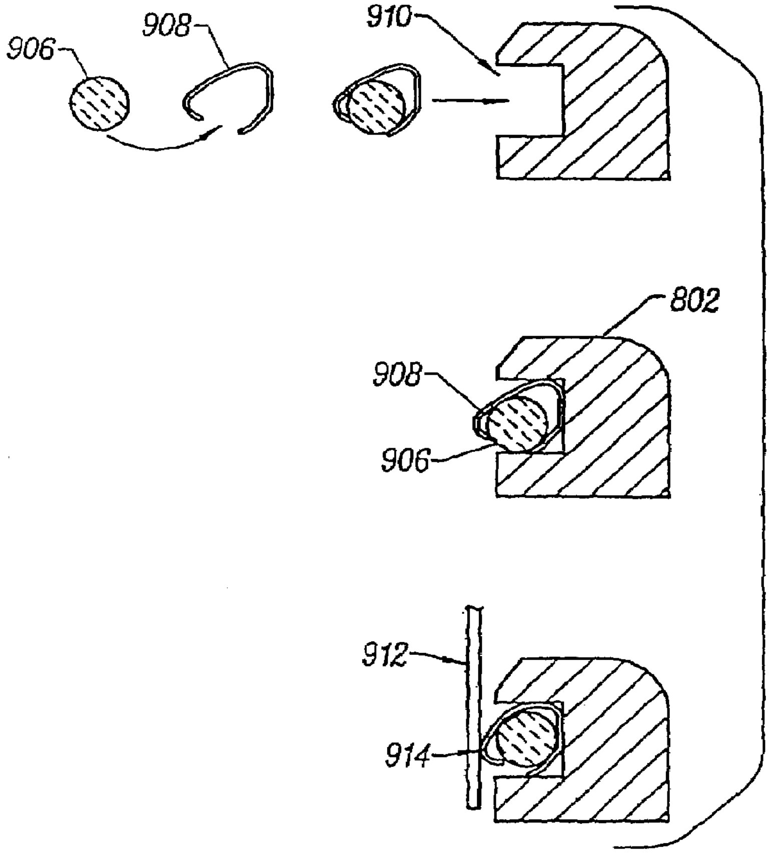
FIG. 9 is a cross sectional side view of an adapter plate in accordance with a specific embodiment of the present invention.
Figure 13:
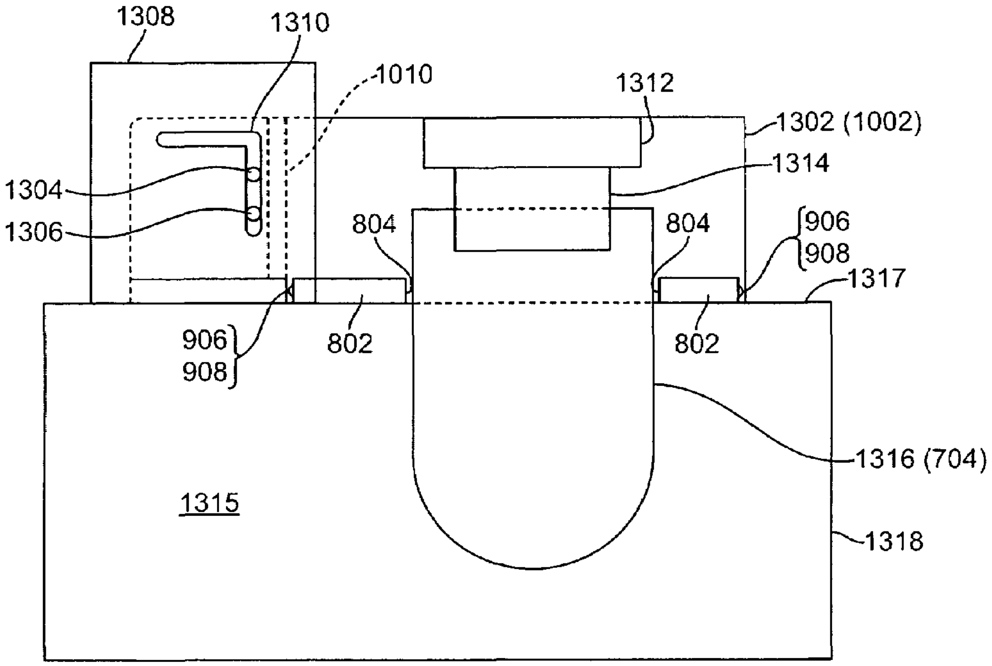
FIG. 13 is a schematic side-view diagram of a VED under a cover in position in an enclosure in accordance with one embodiment of the present invention.

FIG. 8 is a perspective elevation view of an adapter plate in accordance with a specific embodiment of the present invention. FIG. 9 is a cross sectional side view of an adapter plate in accordance with a specific embodiment of the present invention. As illustrated in FIG. 3, cover 302 is seated on top of top plate 313 of frame 315, or the top surface 1317 of a VED enclosure 1318 in an embodiment as shown in FIG. 13. Adapter plate 802 provides an intimate seal for air and RF. Adapter plate 802 has an opening 804 for receiving a VED such that the exterior surface of the VED is in continuous contact with the surface defining opening 804.

Figure 9A:
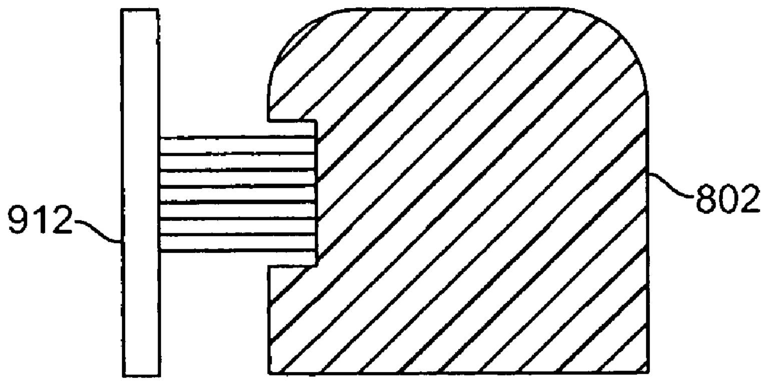
FIG. 9A is a cross sectional side view of an adapter plate in accordance with a second specific embodiment of the present invention.
Figure 9B:
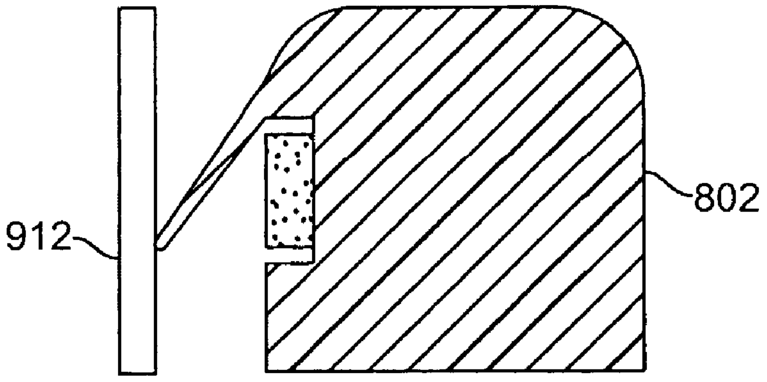
FIG. 9B is a cross sectional side view of an adapter plate in accordance with a third specific embodiment of the present invention.

Adapter plate 802, at its outer perimeter 810, seals cover 302 from the bottom (see FIG. 13). In FIG. 9, plate 802 has an exterior seal at its outer perimeter 810 that consists of two parts: a sponge cord 906 and a finger stock 908. Sponge cord 906 is fed into finger stock 908, and both are placed into a groove 910 located continuously around the outer perimeter of adapter plate 802. Finger stock 908 is formed of a conductive material and forms a continuous contact between the bottom portion of the interior of walls 912 of cover 302 and the outer perimeter of adapter plate 802. When adapter plate 802 is disposed within cover 302 in a closed position of the cover (FIG. 13), finger stock 908 are compressed against the sponge cord, consequently providing an air tight seal with a positive ground contact 914 against the bottom portion of the interior of walls 912 of cover 302. Such interface requires low compressive force and also allows for manufacturing variance. For example, copper bristle/brush seals (FIG. 9A) and canted coil-springs with sponge core (FIG. 9B) are alternatives. A separate composite brush seal or o-ring can also be incorporated into the design. Adapter plate 802 allows vertical height variance while maintaining contact and RF seal.

Figure 10:
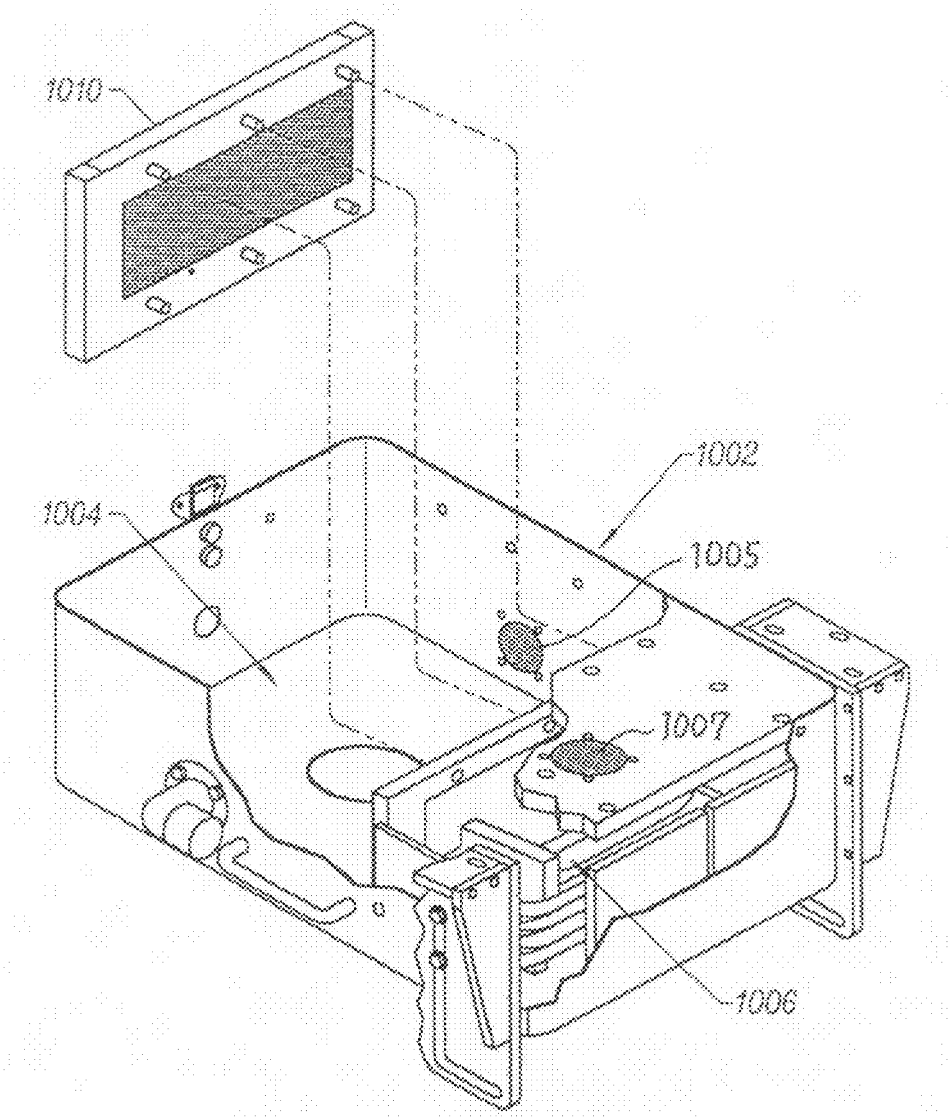
FIG. 10 is a perspective elevation view of a panel and an input circuit of a VED enclosure in accordance with a specific embodiment of the present invention.
Figure 10A:
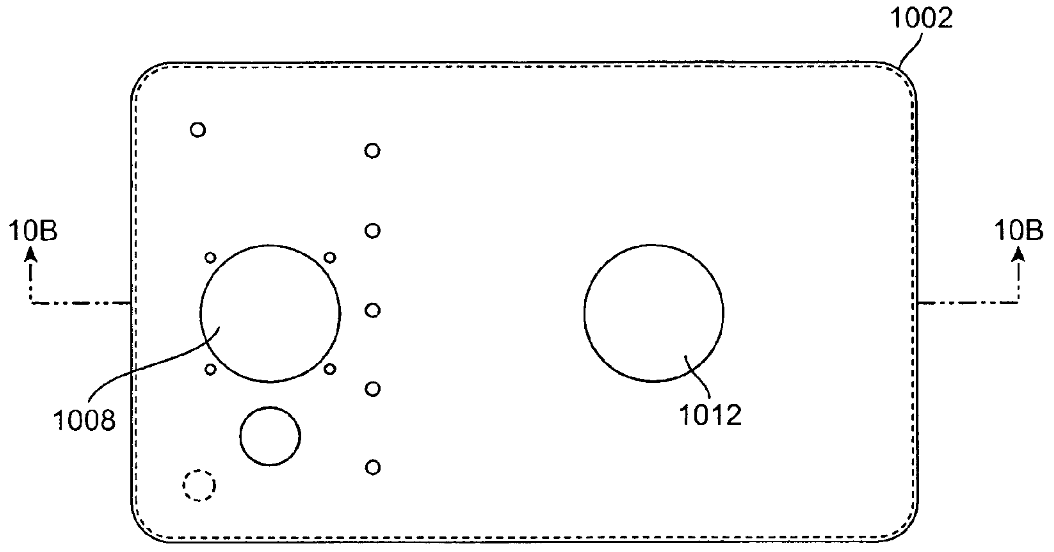
FIG. 10A is a top view of an input circuit of VED enclosure in accordance with a specific embodiment of the present invention.
Figure 10B:
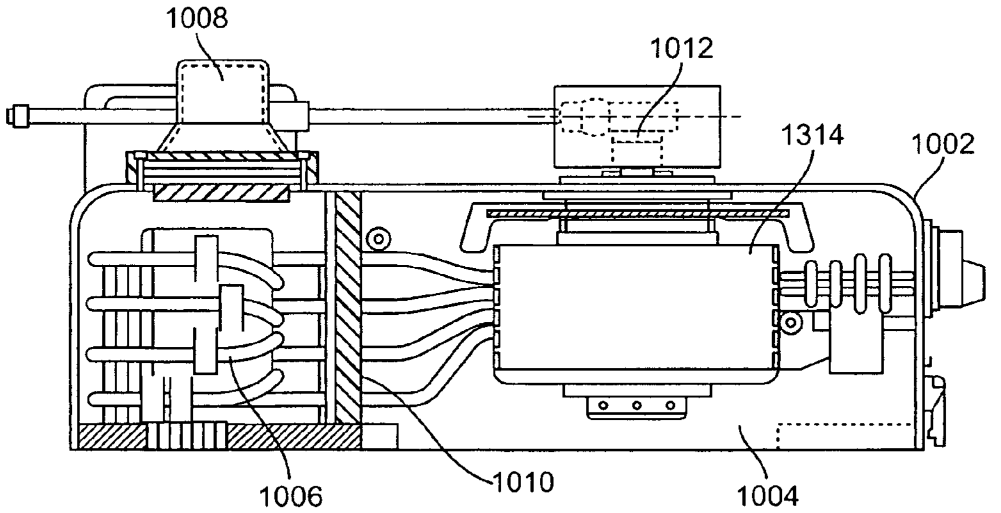
FIG. 10B cross-sectional side plan elevation view of an input circuit of a VED enclosure in accordance with a specific embodiment of the present invention.

FIG. 10 is a perspective elevation view of an input circuit of a VED cover 1002 similar to cover 302 of FIG. 3 in accordance with a specific embodiment of the present invention. FIG. 10A is a top view of a cover 1002 similar to cover 302 (FIG. 3) and containing an input circuit of a VED in accordance with a specific embodiment of the present invention. FIG. 10B is a cross-sectional side plan elevation view of an input circuit of a VED in accordance with a specific embodiment of the present invention. Cover 1002 has two chambers 1004 and 1006. Chamber 1004 forms a portion of a compartment for a VED and has a first air passageway 1005. Chamber 1006 encloses a high voltage circuit for the VED and is connected to an air input system 1008 (FIGS. 10A, 10B). Chamber 1006 has a second air passageway 1007. Chambers 1004 and 1006 are separated by a panel 1010 that allows air to circulate while RF is isolated. Chamber 1004 is connected to an RF input 1012.

Figure 10C:
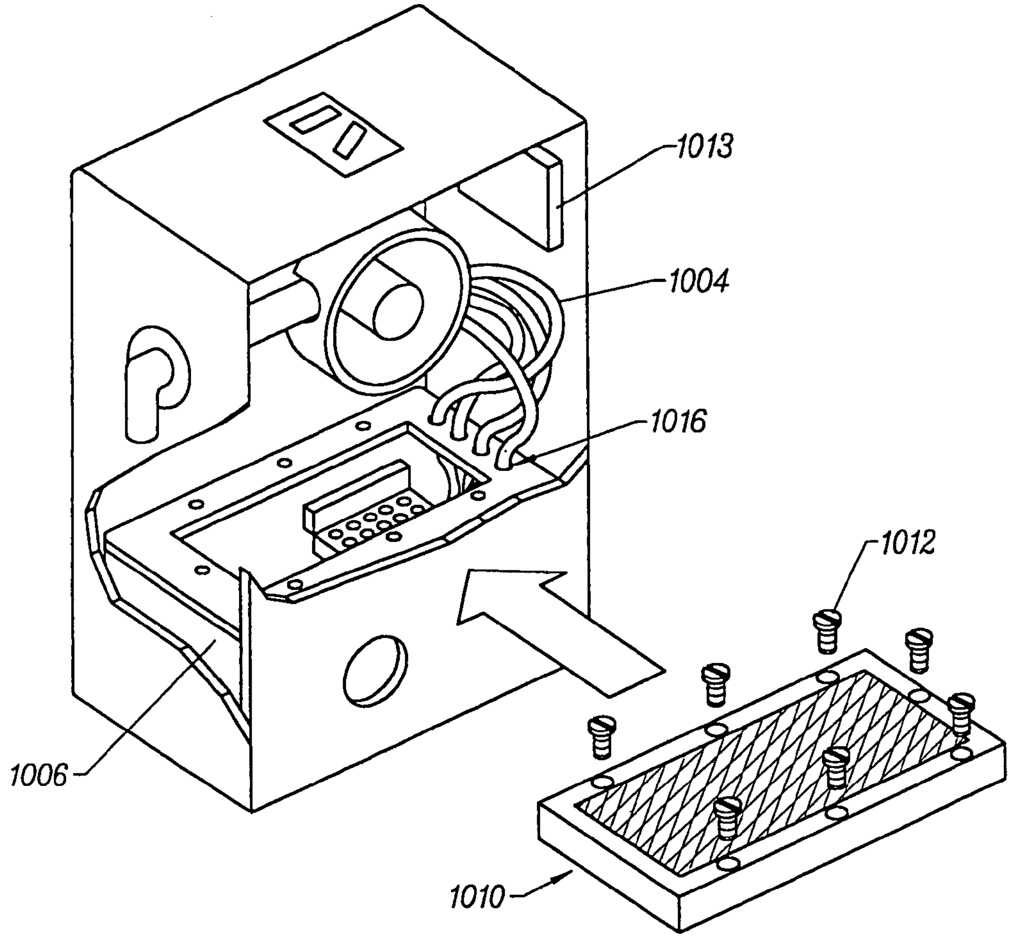
FIG. 10C is a perspective view of a panel and an input circuit of a VED enclosure in accordance with a specific embodiment of the present invention.
Figure 10D:
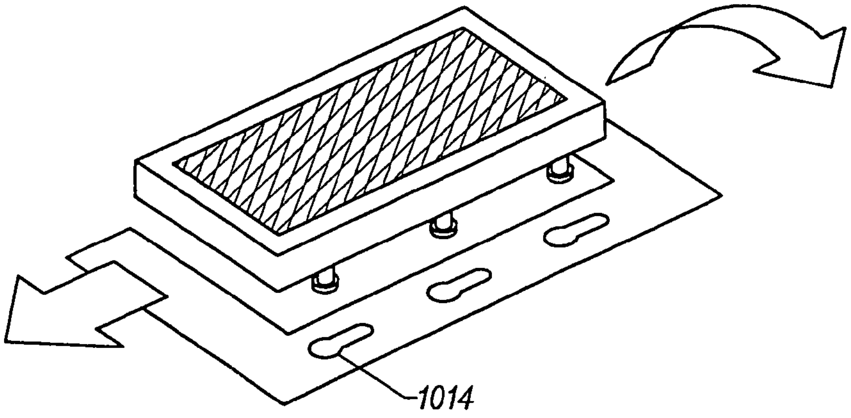
FIG. 10D is a perspective view of a panel and an input circuit of a VED enclosure in accordance with a alternative embodiment of the present invention.

RF isolation is first accomplished using absorbing materials, such as tiles 1013 (FIG. 10C) mounted on a flat surface within chamber 1004. Further isolation is accomplished by a partition on which panel 1010 also known as "honeycomb" or "waveguide beyond cutoff" EMI vent is mounted. Panel 1010 allows air to flow while cutting off RF from chamber 1004. Another purpose for panel 1010 is easy access for high voltage connection in chamber 1006. For example, panel 1010 can be mounted either with fasteners 1012 as illustrated in FIG. 10C, or with a quick-release system using keyhole slots 1014 as illustrated in FIG. 10D.

Chamber 1006 has holes 1016 to feed high voltage wires through thus minimizing the amount of RF entering chamber 1006. Within chamber 1004, additional RF isolation components, such as filters, chokes, bobbins and ferrites, can be installed to sufficiently minimize RF coupling to the high voltage cables. Air input system 1008 provides an air flow distribution within chamber 1006 and chamber 1004 sufficient for cooling components within both chambers.

Figure 1:
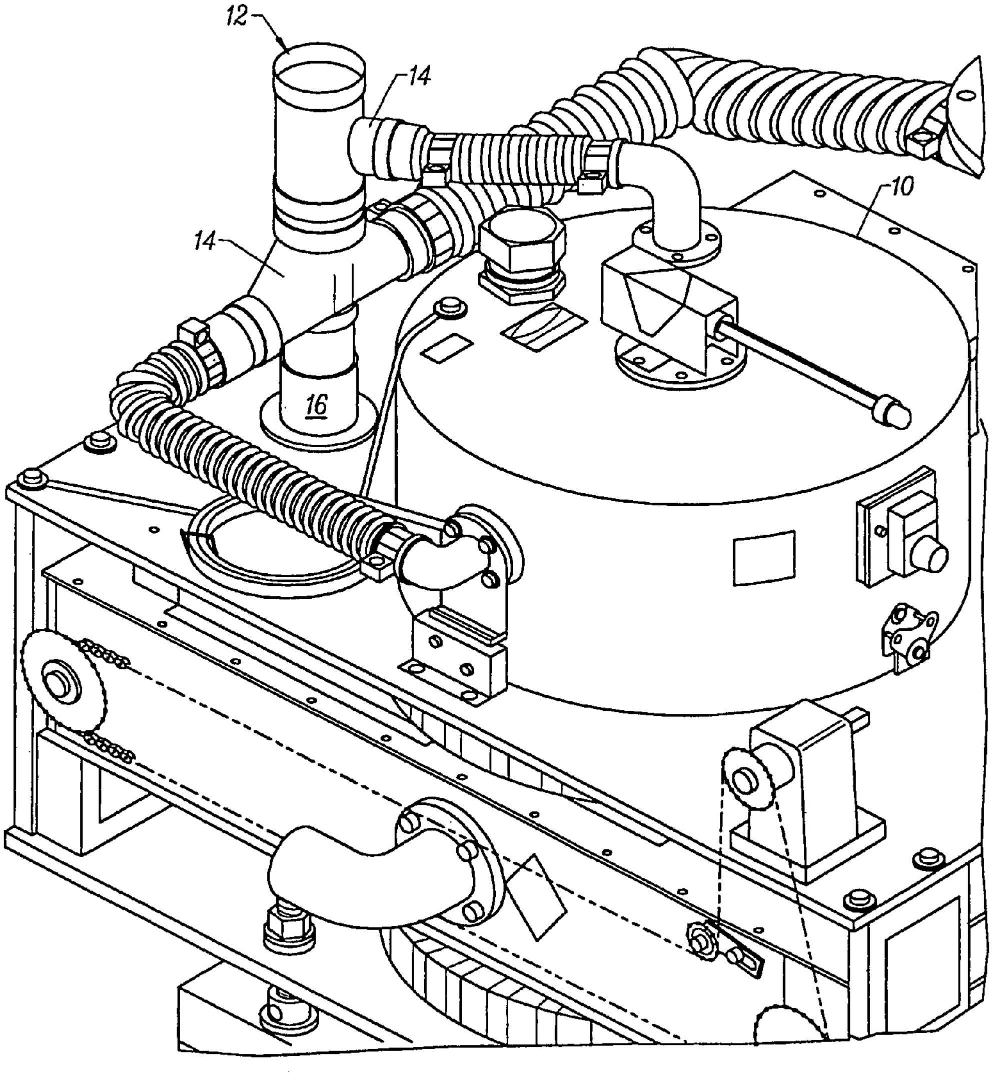
FIG. 1 (Prior Art)
FIG. 1 is a perspective view of a conventional input circuit and enclosure of an amplifier employing a VED in accordance with the prior art.
Figure 2:
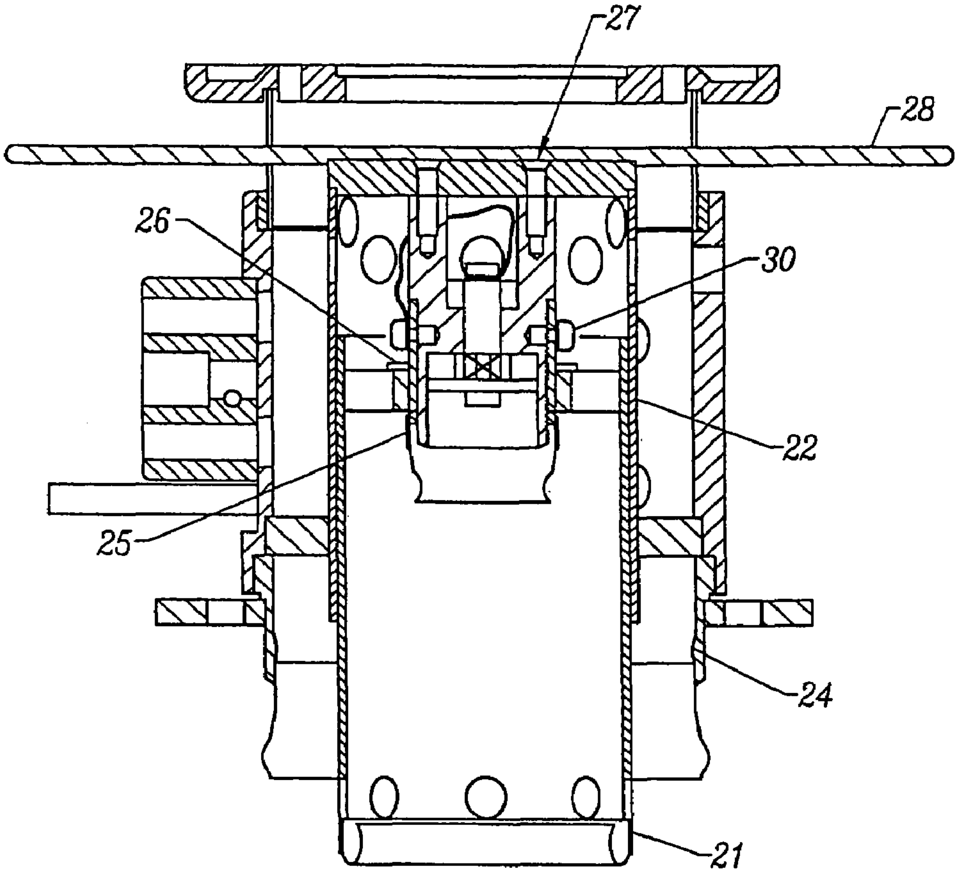
FIG. 2 (Prior Art)
FIG. 2 is a cross-sectional drawing of a socket for a VED in accordance with the prior art.
Figure 11:
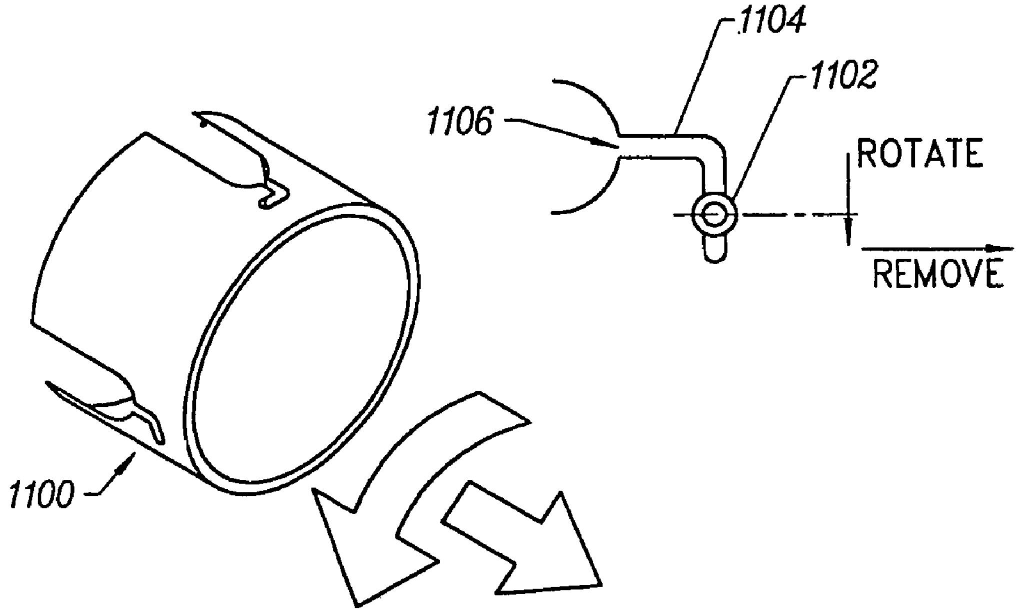
FIG. 11 is a perspective view of a corona shield in accordance with a specific embodiment of the present invention.

FIG. 11 is a perspective view of a corona shield in accordance with a specific embodiment of the present invention. To remove a corona shield 1100 component of a VED in the conventional socket interface as illustrated in FIG. 2, screws 30 must be removed. Such task may be difficult as it leads to more reassembling complication. The present design only requires loosening fasteners 1102 around corona shield 1100 and rotating corona shield 1100. This eliminates positioning and reinserting screws 30. An L-shaped track 1104 starting at an opening 1106 guides the movement of corona shield 1100 with respect to fasteners 1102. When fasteners 1102 become loose, corona shield 1100 can rotate along track 1104 until it reaches the end corner of track 1104. To completely remove corona shield 1100, corona shield 1100 may be pulled away.

Figure 12A:
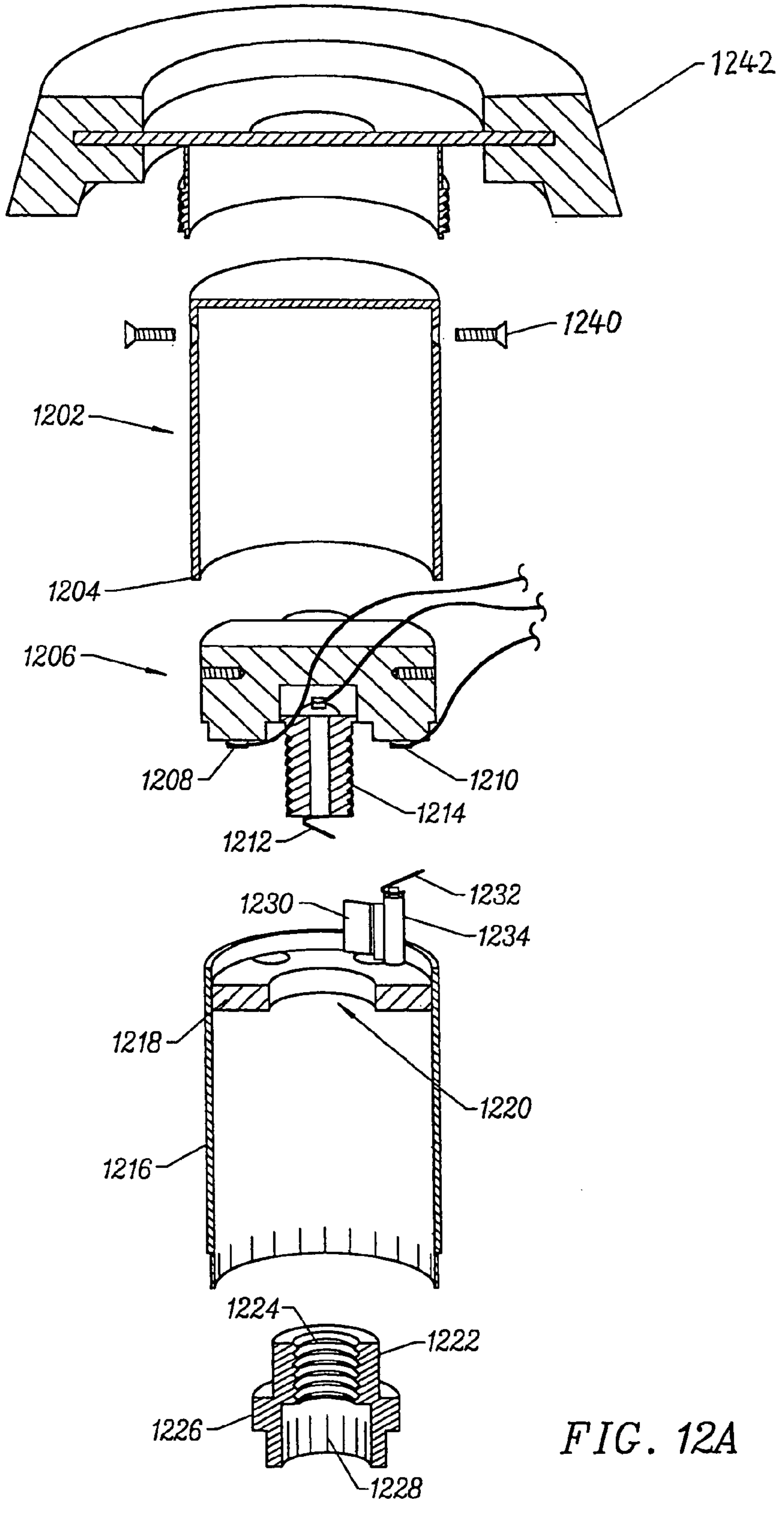
FIG. 12A is a cross-sectional perspective view of input circuit socket interface in accordance with a specific embodiment of the present invention.
Figure 12B:
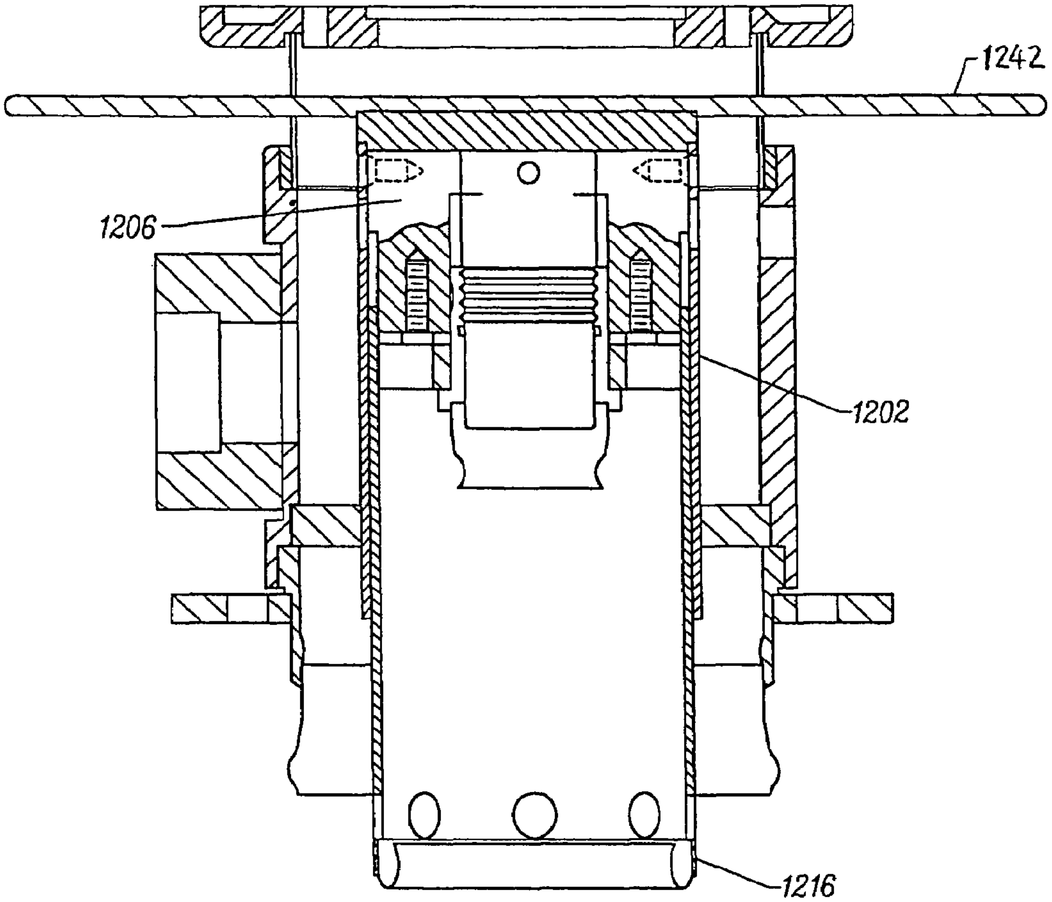
FIG. 12B is a cross-sectional side view of an input circuit socket interface in accordance with a specific embodiment of the present invention.

FIGS. 12A and 12B illustrate cross-sectional side views of an input circuit socket interface in accordance with a specific embodiment of the present invention.

An outer cathode line 1202 in the shape of a hollow cylinder formed of a conductive material has a VED connection end 1204. A contact block 1206 is removably positioned within outer cathode line 1202. Contact block 1206 has an inner cathode contact 1208, a heater contact 1210, and a vacuum ion pump contact 1212. Contact block 1206 also has a threaded stem 1214 extending towards VED connection end 1204 of outer cathode line 1202. Vacuum ion pump contact 1212 is located at the end of threaded stem 1214.

An inner cathode line 1216 comprising a hollow cylinder formed of a conductive material and a support plate 1218 is removably positioned within outer cathode line 1202. Support plate 1218 is positioned transversely inside of inner cathode contact line 1216. An opening 1220 in the center of support plate 1218 removably receives threaded stem 1214.

A heater contact line 1222 having internal threads and hex for easy removal is coupled to inner cathode line 1216. Heater contact line 1222 has a threaded hollow cylinder 1224 having a flange 1226 on its exterior. Threaded stem 1214 receives threaded hollow cylinder 1224 such that heater contact line 1222 is in contact with heater contact 1210. Flange 1226 is in contact with support plate 1218. Inner cathode line 1216 is held in position against contact block 1206. Heater contact line 1222 has threads 1228 near the VED connection. Threads 1228 are used for applying torque to heater contact line 1222 using a tool.

This new configuration allows all parts to be easily accessible by removing heater contact line 1222 with a simple tool. Heater contact line 1222 is fastened to contact block 1206 with screw threads 1228 and holds inner cathode line 1216 in place. As a result, inner cathode line 1216 with filter components 1230 attached can be removed. Filter components 1230 are mounted with an electrically nonconductive standoff, i.e. ceramic or nylon, and connected to an outer cathode line contact 1232 and an inner cathode line contact 1234 with contact fingers. Contact block 1206 also uses fingers to contact inner cathode line 1216 and heater contact line 1222. For the heater contact line 1222, a wave washer or a plate washer with a tab for mounting may be used for contact. Contact block 1206 may be mounted to outer cathode line 1202 using flat-head screws 1240 radially inward. Screws 1240 are oriented that way instead of on the top of outer cathode line 1202 to avoid improper seating of a high voltage blocker 1242 to outer cathode line 1202. Vacuum ion pump contact 1212 may be mounted onto contact block 1206 via fasteners and modified to receive heater contact line 1222 as illustrated in FIG. 12B.

FIG. 13 illustrates the cover and enclosure of a Vacuum Electron Device (VED) using an enclosure embodiment in lieu of the frame arrangement of FIG. 3. The enclosure in this case is designated 1318 and has an interior portion 1315 defined at the top by a surface 1317. The cover 1302, similar to covers 302 and 500, includes an input circuit 1312 coupled to the ceiling of the cover 1302. The input circuit 1312 also houses a socket 1314 designed to mate with a VED (not shown) disposed in casing 1316 using the afore-described mechanism intended to prevent bending or damage to the socket contact fingers (not shown) protruding towards the VED. The cover 1302 has, on opposite sides, two guides 1304, 1306 mating with a guide track 1310 from a guide plate 1308 as previously described.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A radio frequency (RF) isolation system for a vacuum electron device (VED), the VED having a first end, an emitter region and an exterior surface, the first end having a high voltage connection:

- a removable cover having walls defining portions of a first chamber and a second chamber, the first chamber adapted to at least partially house a portion of the VED, the second chamber adapted to at least partially house a high voltage circuit for the VED; and
- a plate adapted to receive the VED and to define a portion of the first chamber when the removable cover is in a closed position, the plate having a first outer perimeter portion adapted to establish substantially continuous electrical contact with walls of the removable cover when the removable cover is in the closed position.

2. The system according to claim 1 wherein the plate is formed of a conductive material, the outer perimeter portion thereof comprising:

- a groove continuing completely around the outer perimeter of the plate;
- a finger stock formed of a conductive material, the finger stock located in the groove, the finger stock forming a substantially continuous contact between the enclosure wall and the outer perimeter of the plate; and
- a sponge cord located within the finger stock.

3. The system according to claim 1, wherein the outer perimeter portion substantially seals against the cover and provides ground contact when the cover is in the closed position.

4. The system according to claim 1, further comprising:

- a first air passageway provided to the first chamber, the first air passageway communicating between the inside of the first chamber and a first external air connection;
- a second air passageway provided to the second chamber, the second air passage way communicating between the inside of the second chamber and a second external air connection; and
- a partition separating the first chamber and the second chamber, the partition minimizing radio frequency entering the second chamber from the first chamber while allowing air flow therethrough.

5. The system according to claim 3, wherein the outer perimeter portion includes:

copper bristle/brush seals.

6. The system according to claim 3, wherein the outer perimeter portion includes:

canted coil-springs having sponge core.

7. A cover assembly for a vacuum electron device (VED), the cover assembly being configured for motion between an open and a closed position, the cover assembly comprising:

a first chamber having an opening and adapted to be substantially sealed by a plate disposed in the opening when the cover assembly is in the closed position and to be substantially unsealed when the cover assembly is in the open position, the VED being disposed partially in said first chamber and partially outside said first chamber in the closed position, the first chamber having a first air passageway communicating between the inside of the first chamber and a first external air connection;

a second chamber adapted to enclose a high voltage circuit for the VED, the second chamber having a second air passageway communicating between the inside of the second chamber and a second external air connection; and a partition separating the first chamber and the second chamber, the partition including an EMI isolation panel configured to permit passage of air between the first chamber and the second chamber.

8. The cover assembly according to claim 7 wherein the EMI vent panel allows for air flow while minimizing the amount of radio frequency entering the second chamber.

9. A cover assembly for a vacuum electron device (VED), the cover assembly being configured for motion between an open and a closed position, the cover assembly comprising:

a first chamber having an opening and configured to form a portion of an enclosure for the VED, the VED being disposed partially in the first chamber and partially outside the first chamber, the first chamber having a first air passageway communicating between the first chamber and a first external air connection, the first chamber being configured to be substantially sealed by a plate disposed in the opening when the cover assembly is in the closed position and to be substantially unsealed when the cover assembly is in the open position;

a second chamber configured to enclose a high voltage circuit of the VED, the second chamber having a second air passageway communicating between the an inside of the second chamber and a second external air connection; and means for minimizing radio frequency entering the second chamber from the first chamber.

10. The cover assembly according to claim 9, wherein the means for minimizing is configured to allow air flow between the first and second chambers.

* * * * *